US012764851B2

(12) United States Patent
Hartig, Jr.

(10) Patent No.: US 12,764,851 B2
(45) Date of Patent: *Oct. 13, 2026

(54) POWER TOOLS WITH HIGH-EMISSIVITY HEAT SINKS

(71) Applicant: MILWAUKEE ELECTRIC TOOL CORPORATION, Brookfield, WI (US)

(72) Inventor: Steven LCB Hartig, Jr., Baltimore, MD (US)

(73) Assignee: Milwaukee Electric Tool Corporation, Brookfield, WI (US)

( * ) Notice: Subject to any disclaimer, the term of this patent is extended or adjusted under 35 U.S.C. 154(b) by 128 days.

This patent is subject to a terminal disclaimer.

(21) Appl. No.: 18/751,528

(22) Filed: Jun. 24, 2024

(65) Prior Publication Data

US 2024/0416497 A1 Dec. 19, 2024

Related U.S. Application Data

(63) Continuation of application No. 17/051,231, filed as application No. PCT/US2020/038909 on Jun. 22, 2020, now Pat. No. 12,017,336.

(Continued)

(51) Int. Cl.

*H05K 7/20* (2006.01)
*B25F 5/00* (2006.01)
*H05K 1/02* (2006.01)

(52) U.S. Cl.

CPC ........... *H05K 1/0209* (2013.01); *B25F 5/008* (2013.01); *H05K 7/209* (2013.01)

(58) Field of Classification Search

None

See application file for complete search history.

(56) References Cited

U.S. PATENT DOCUMENTS 6,350,634 B2 * 2/2002 Ma ...................... H01L 23/4334 438/126
7,109,613 B2 9/2006 Lui (Continued)

FOREIGN PATENT DOCUMENTS

DE 102007062990 A1 6/2009
DE 102010035169 A1 2/2012

(Continued)

OTHER PUBLICATIONS

European Patent Office Action for Application No. 20831914.5 dated Feb. 14, 2025 (7 pages).

(Continued)

*Primary Examiner* — Courtney L Smith

(74) *Attorney, Agent, or Firm* — Michael Best & Friedrich LLP

(57) ABSTRACT

Power tool (10) with high emissivity heat sinks (66). One embodiment provides a power tool (10) including a power source, a motor (46), and a power switching network (58) coupled between the power source and the motor (46). The power switching network (58) includes a plurality of switches (62). A heat sink (66) is in a heat-transfer relationship with the plurality of switches (62). The heat sink (66) includes a high emissivity material having an emissivity of greater than or equal to 0.1 and/or a high emissivity finish to increase the emissivity of the heat sink.

20 Claims, 5 Drawing Sheets

Related U.S. Application Data

(60) Provisional application No. 62/865,417, filed on Jun. 24, 2019.

(56) References Cited

U.S. PATENT DOCUMENTS

| | | | | |
|---|---|---|---|---|
| 7,359,628 | B2 | 4/2008 | Broghammer et al. | |
| 8,477,502 | B2 | 7/2013 | Single et al. | |
| 9,451,976 | B2 | 9/2016 | Schneider et al. | |
| 9,756,740 | B2 | 9/2017 | Loong | |
| 10,873,244 | B2 | 12/2020 | Purohit et al. | |
| 11,197,990 | B2 | 12/2021 | Agarwal et al. | |
| 11,229,334 | B2 | 1/2022 | Conrad et al. | |
| 11,444,543 | B2 * | 9/2022 | Riou | H02P 27/06 |
| 12,017,336 | B2 * | 6/2024 | Hartig, Jr. | B25F 5/008 |
| 2008/0055862 | A1 * | 3/2008 | Yu | H01L 23/4006 257/E23.084 |
| 2008/0179078 | A1 | 7/2008 | Opsitos | |
| 2010/0148894 | A1 | 6/2010 | Ohashi et al. | |
| 2013/0313836 | A1 * | 11/2013 | Leininger | H02K 1/278 290/1 A |
| 2014/0334106 | A1 | 11/2014 | Prest et al. | |
| 2015/0311137 | A1 | 10/2015 | Oganesian | |
| 2018/0084646 | A1 | 3/2018 | Purohit et al. | |
| 2018/0202571 | A1 * | 7/2018 | Fukuzawa | F16K 31/06 |
| 2018/0248446 | A1 * | 8/2018 | Mergener | H02K 21/046 |
| 2018/0342932 | A1 * | 11/2018 | Wachter | H02K 11/33 |
| 2019/0334459 | A1 | 10/2019 | Chen et al. | |
| 2020/0006021 | A1 * | 1/2020 | Lewis | H01H 13/14 |
| 2021/0289658 | A1 * | 9/2021 | Lee | B25F 5/008 |

FOREIGN PATENT DOCUMENTS

| | | | |
|---|---|---|---|
| EP | 1832392 | A1 | 9/2007 |
| EP | 1781074 | B1 | 10/2012 |
| JP | 2010110881 | A | 5/2010 |
| WO | 2011047959 | A1 | 4/2011 |
| WO | 2011138670 | A2 | 11/2011 |
| WO | 2017173000 | A1 | 10/2017 |
| WO | 2018053729 | A1 | 3/2018 |

OTHER PUBLICATIONS

International Search Report and Written Opinion for Application No. PCT/US2020/038909 dated Oct. 5, 2020 (8 pages).

The Engineering Toolbox, “Emissivity Coefficient Materials,” <https://www.engineeringtoolbox.com/emissivity-coefficients-d_447.html> web page publicly available at least as early as Oct. 27, 2020.

Extended European Search Report for Application No. 20831914.5 dated May 30, 2023 (9 pages).

* cited by examiner

POWER TOOLS WITH HIGH-EMISSIVITY HEAT SINKS

RELATED APPLICATIONS

This application is a continuation of U.S. application Ser. No. 17/051,231, filed on Oct. 28, 2020, which is a national phase filing under 35 U.S.C. § 371 of International Application No. PCT/US2020/038909, filed on Jun. 22, 2020, which claims the benefit of U.S. Provisional Patent Application No. 62/865,417, filed on Jun. 24, 2019, the entire content of which is hereby incorporated by reference.

FIELD

Embodiments described herein relate to power tools including heat sinks.

BACKGROUND

Some power tools include a brushless direct current motor to drive a tool bit to perform work on a workpiece. The motor is driven by a power switching network, such as, for example, an inverter switch bridge, an H-bridge, or the like. The power switching network includes a plurality of transistors (e.g., six field effect transistors [FETs]) that are switched at high-frequencies to drive the motor. These FETs used in the power switching network may generate heat during operation.

SUMMARY

In certain scenarios, the heat generated by the FETs may damage the FETs or other electrical components in the power tool. To remove the heat generated by the FETs, some power tools include a fan attached to and driven by the motor. The fan generates a cooling air flow within the power tool that may remove some of the heat generated by the FETs. In power tools that drive motors for a prolonged period of time, for example, drills, saws, and the like, the fan may generate sufficient air circulation to dissipate the heat generated by the FETs. In contrast, in power tools that drive motors intermittently for shorter periods of time, for example, nailers and the like, air circulation generated by the fan may not be sufficient to dissipate the excess heat generated by the FETs.

In one example, a roofing nailer may be used to complete about 400 actuations at an ambient temperature of 130° F./55° C. The roofing nailer is expected to deliver this performance even at elevated temperatures. However, the motor of the roofing nailer spins for a limited amount of time with an actuation being completed in, for example, under 0.25 seconds. The motor-driven fan generates limited airflow to cool the electronics compared to, for example, a drill. To compensate for the limited airflow, a heat sink may also be used to dissipate heat from the FETs of the power switching network. However, even with a heat sink, the power tool may shutdown in certain scenarios because the tool reaches a predetermined high temperature threshold (e.g., 90° C.).

Power tools described herein include a power source, a motor, and a power switching network coupled between the power source and the motor. The power switching network includes a plurality of switches. A heat sink is in a heat-transfer relationship with the plurality of switches. The heat sink includes a high emissivity material having an emissivity of greater than or equal to 0.1.

Power tools described herein include a power source, a motor, and a power switching network coupled between the power source and the motor. The power switching network includes a plurality of switches. A heat sink is in a heat-transfer relationship with the plurality of switches. The heat sink includes a high emissivity finish to increase the emissivity of the heat sink.

Other aspects of the invention will become apparent by consideration of the detailed description and accompanying drawings.

Figure 1:
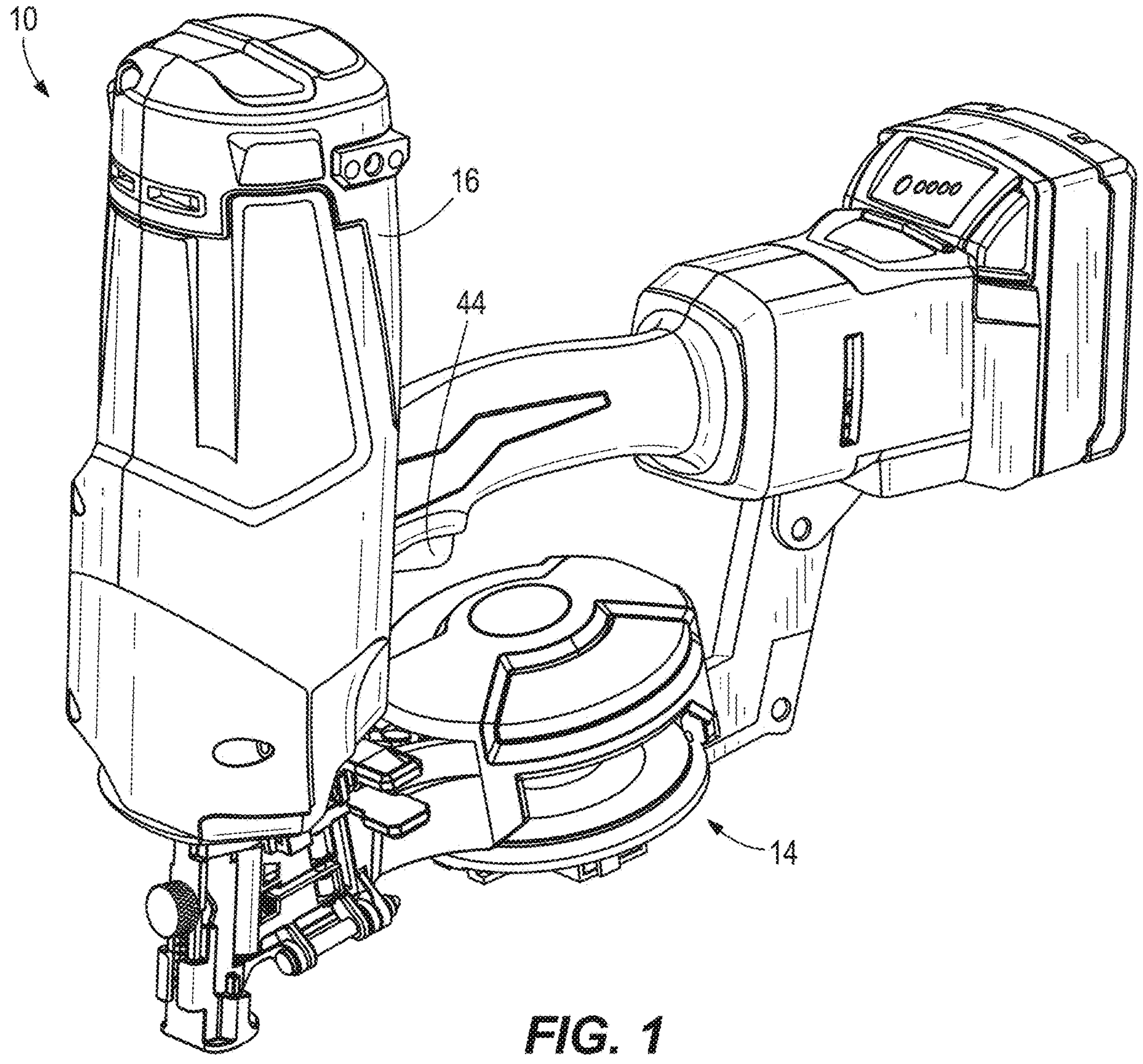
FIG. 1 is a perspective view of a power tool in accordance with some embodiments.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers," "computing devices," "controllers," "processors," etc., described in the specification can include one or more processing units, one or more computer-readable medium modules, one or more input/output interfaces, and various connections (e.g., a system bus) connecting the components.

Relative terminology, such as, for example, "about," "approximately," "substantially," etc., used in connection with a quantity or condition would be understood by those of ordinary skill to be inclusive of the stated value and has the meaning dictated by the context (e.g., the term includes at least the degree of error associated with the measurement accuracy, tolerances [e.g., manufacturing, assembly, use, etc.] associated with the particular value, etc.). Such terminology should also be considered as disclosing the range defined by the absolute values of the two endpoints. For example, the expression "from about 2 to about 4" also discloses the range "from 2 to 4". The relative terminology may refer to plus or minus a percentage (e.g., 1%, 5%, 10%, or more) of an indicated value.

It should be understood that although certain drawings illustrate hardware and software located within particular devices, these depictions are for illustrative purposes only. Functionality described herein as being performed by one component may be performed by multiple components in a distributed manner. Likewise, functionality performed by multiple components may be consolidated and performed by a single component. In some embodiments, the illustrated components may be combined or divided into separate software, firmware and/or hardware. For example, instead of being located within and performed by a single electronic processor, logic and processing may be distributed among multiple electronic processors. Regardless of how they are combined or divided, hardware and software components may be located on the same computing device or may be distributed among different computing devices connected by one or more networks or other suitable communication links. Similarly, a component described as performing particular functionality may also perform additional functionality not described herein. For example, a device or structure that is "configured" in a certain way is configured in at least that way but may also be configured in ways that are not explicitly listed.

DETAILED DESCRIPTION

Figure 2:
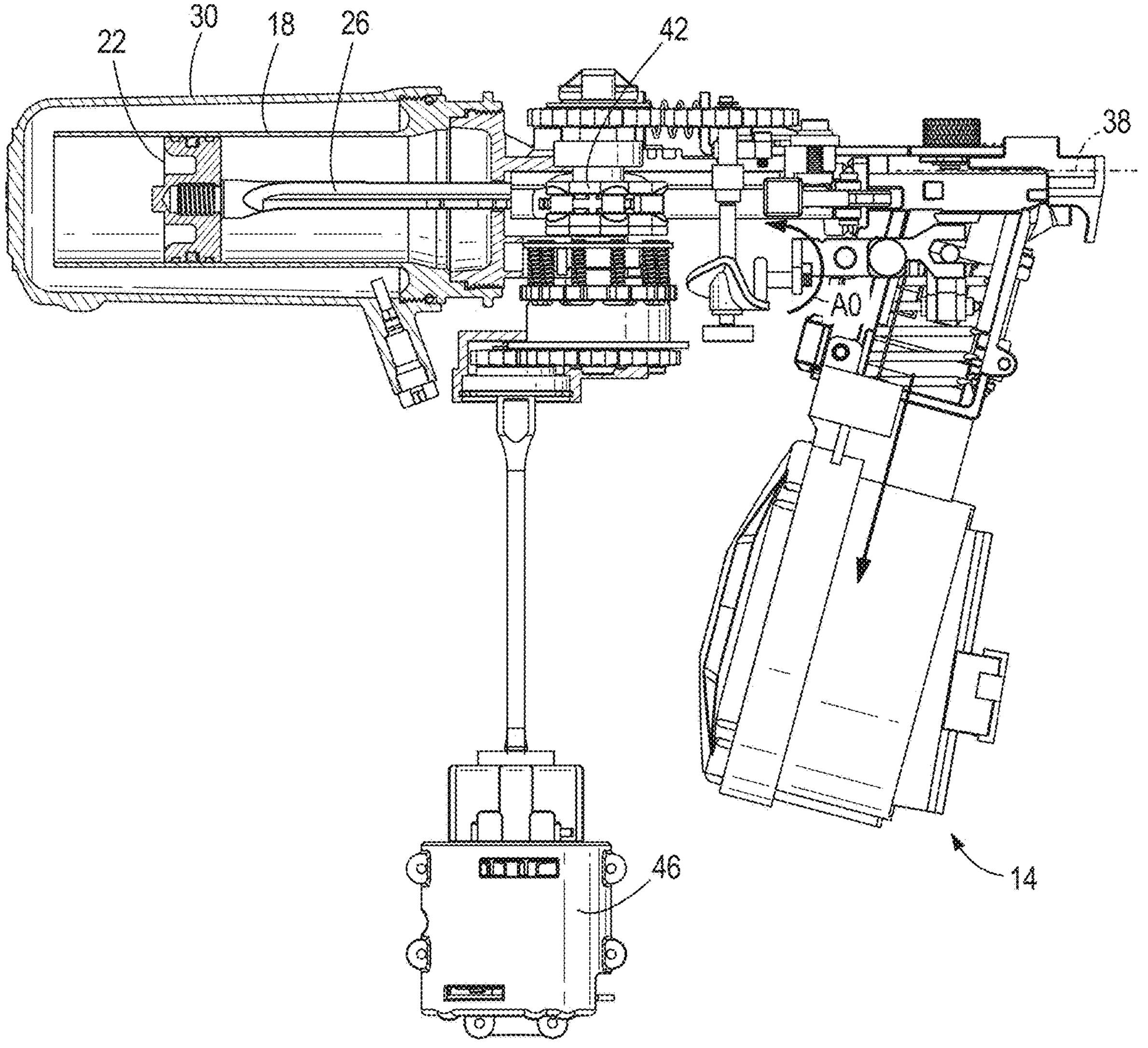
FIG. 2 is a plan view of the power tool of FIG. 1, with the housing removed, illustrating a lifting mechanism.

With reference to FIGS. 1 and 2, a power tool 10, for example, a gas spring-powered fastener driver 10 is operable to drive fasteners (e.g., nails) held within a canister magazine 14 into a workpiece. The fastener driver 10 includes a housing 16, a cylinder 18 positioned within the housing 16, and a moveable piston 22 positioned within the cylinder 18. The fastener driver 10 can be powered by a power source, such as, for example, a removable and rechargeable battery pack. The fastener driver 10 further includes a driver blade 26 that is attached to the piston 22 and moveable therewith. The fastener driver 10 does not require an external source of air pressure, but rather includes a storage chamber cylinder 30 of pressurized gas in fluid communication with the cylinder 18. In the illustrated embodiment, the cylinder 18 and moveable piston 22 are positioned within the storage chamber cylinder 30.

With reference to FIG. 2, the cylinder 18 and the driver blade 26 define a driving axis 38, and during a driving cycle the driver blade 26 and piston 22 are moveable between a ready position (i.e., top dead center) and a driven position (i.e., bottom dead center). The fastener driver 10 further includes a lifting mechanism 42, which is powered by a motor 46, and which is operable to move the driver blade 26 from the driven position to the ready position.

In operation, the lifting mechanism 42 drives the piston 22 and the driver blade 26 to the ready position by energizing the motor 46. As the piston 22 and the driver blade 26 are driven to the ready position, the gas above the piston 22 and the gas within the storage chamber cylinder 30 is compressed. Once in the ready position, the piston 22 and the driver blade 26 are held in position until released by user activation of a trigger 44. When released, the compressed gas above the piston 22 and within the storage chamber cylinder 30 drives the piston 22 and the driver blade 26 to the driven position, thereby driving a fastener into a workpiece. The illustrated fastener driver 10 operates on a gas spring principle utilizing the lifting mechanism 42 and the piston 22 to further compress the gas within the cylinder 18 and the storage chamber cylinder 30.

Figure 3:
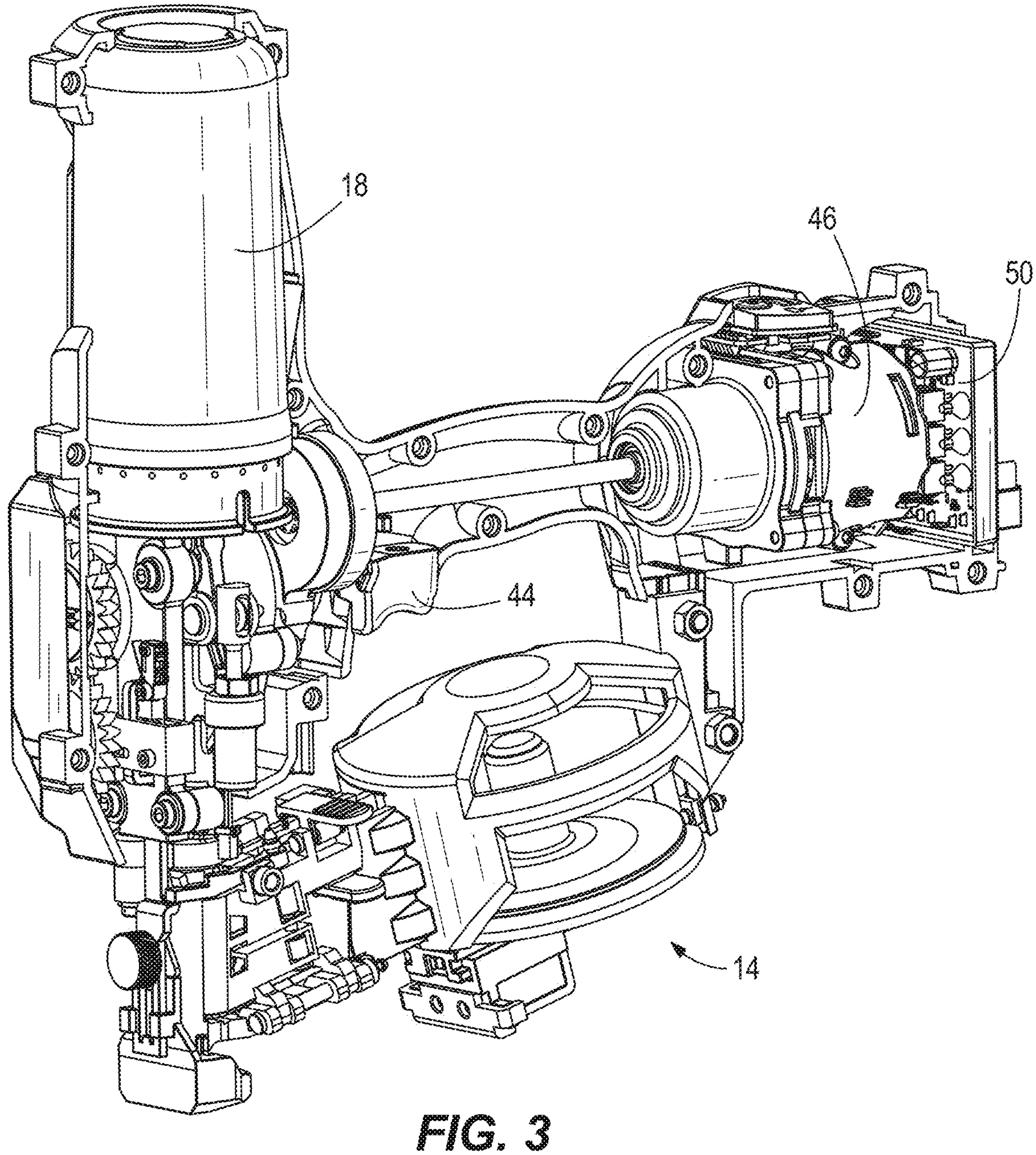
FIG. 3 is a plan view of the power tool of FIG. 1, with the housing removed, illustrating an electronics assembly.
Figure 4:
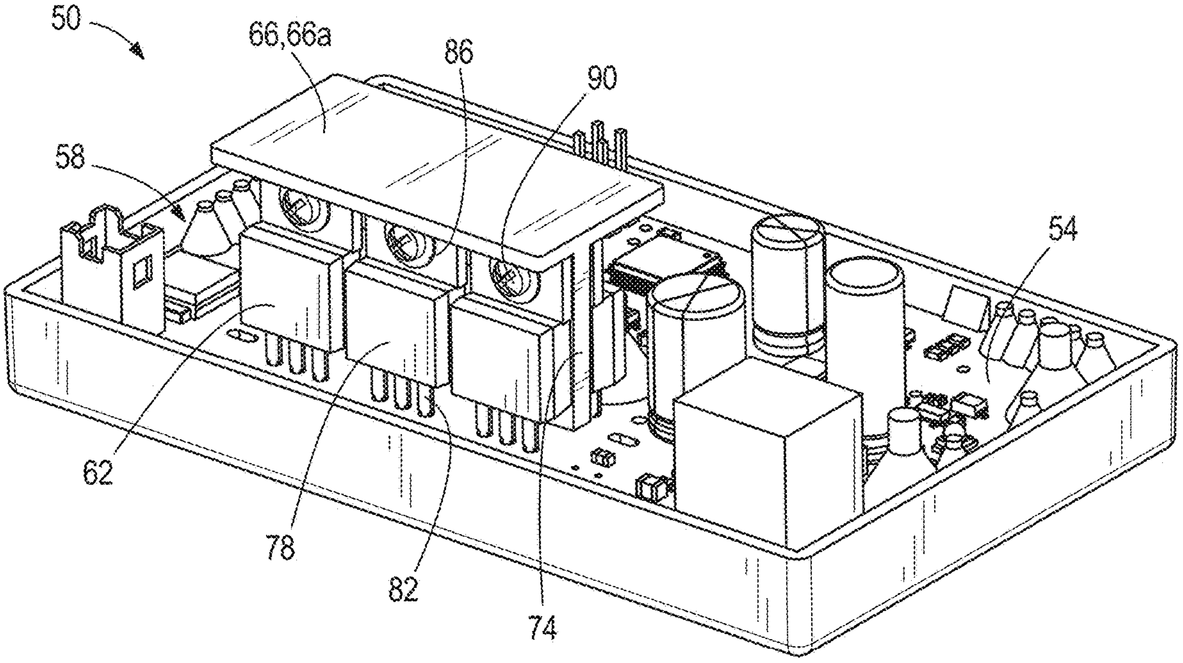
FIG. 4 is a perspective view of an electronics assembly of a power tool in accordance with some embodiments.
Figure 5:
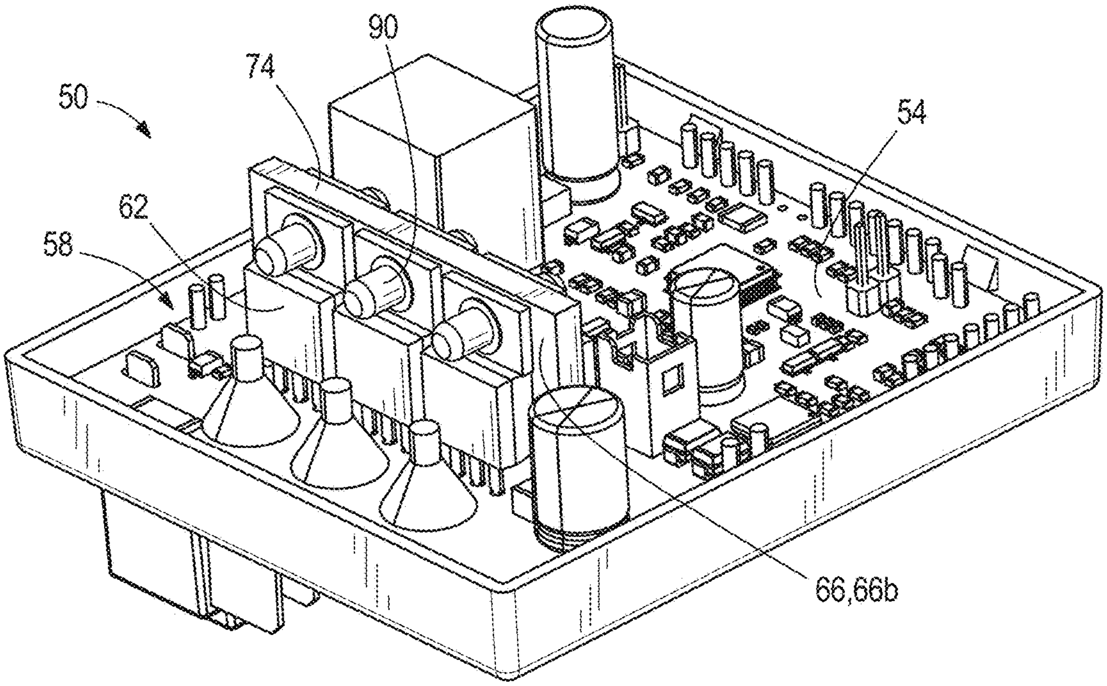
FIG. 5 is a perspective view of an electronics assembly of a power tool in accordance with some embodiments.

FIG. 3 illustrates an electronics assembly 50 for driving the motor 46. As illustrated in FIGS. 4 and 5. The electronics assembly 50 includes a printed circuit board (PCB) 54 and a power switching network 58. The power switching network includes a plurality of switches 62, such as field effect transistors (FETs), mounted on the PCB 54. The electronics assembly 50 also includes a heat sink 66 in a heat-transfer relationship with the plurality of FETs 62.

In the example illustrated in FIGS. 4 and 5, the heat sink 66 is mounted on the PCB 54 and extends in a direction perpendicular to the PCB 54. The heat sink 66 is more particularly identified as heat sink **66*a* in FIG. 4 and heat sink 66*b* in FIG. 5. However, heat sink 66 is used to generically refer to both heat sinks 66*a* and 66*b*. In the embodiment illustrated in FIG. 4, the heat sink 66*a* includes a T-shape such that a horizontal surface 70 is provided parallel to the PCB 54 and a vertical surface 74 extends from the horizontal surface 70 to the PCB 54 in a direction perpendicular to the PCB 54. In the embodiment illustrated in FIG. 5, the heat sink 66*b* includes the vertical surface 74 extending away from the PCB 54 in a direction perpendicular to the PCB 54, but does not include the horizontal surface 70**.

In the examples illustrated in FIGS. 4 and 5, the FETs 62 are stand up FETs such that the FETs 62 extend perpendicular to a connection surface of the PCB 54. Each FET 62 includes a body portion 78, connection terminals 82 extending from a first side of the body portion 78, and a mounting portion 86 extending from a second side of the body portion 78. In the examples illustrated, the connection terminals 82 and the mounting portion 86 are provided on opposite sides of the FET 62. The plurality of FETs 62 are mounted on the PCB 54 by, for example, soldering the connection terminals 82 to corresponding wire traces on the PCB 54. The body portion 78 includes, for example, a cuboid shape with two surfaces having a larger surfaces area compared to the other four surfaces. The body portion 78 extends away from the PCB 54 such that the larger surfaces of the body portion 78 are perpendicular to the PCB 54.

The plurality of FETs 62 are also mounted to or in thermal communication with the heat sink 66. Fasteners 90 are inserted through the mounting portions 86 and secured to the heat sink 66 to mount the plurality of FETs 62 to the heat sink 66. The plurality of FETs 62 are mounted to the heat sink 66 such that one of the larger surfaces of the body portion 78 is facing and in contact with the vertical surface 74 of the heat sink 66. Due to this facing relationship (e.g., heat-transfer relationship) between the body portion 78 and the vertical surface 74, heat generated by the FET 62 during operation is absorbed and dissipated by the heat sink 66. In the example illustrated, six FETs 62 (e.g., FETs 62 of an inverter bridge of the power tool 10) are mounted to the heat sink 66, with three FETs 62 provided on a first side of the vertical surface 74 and the other three FETs 62 provided in a similar manner on a second side of the vertical surface 74 opposite the first side.

Figure 6:
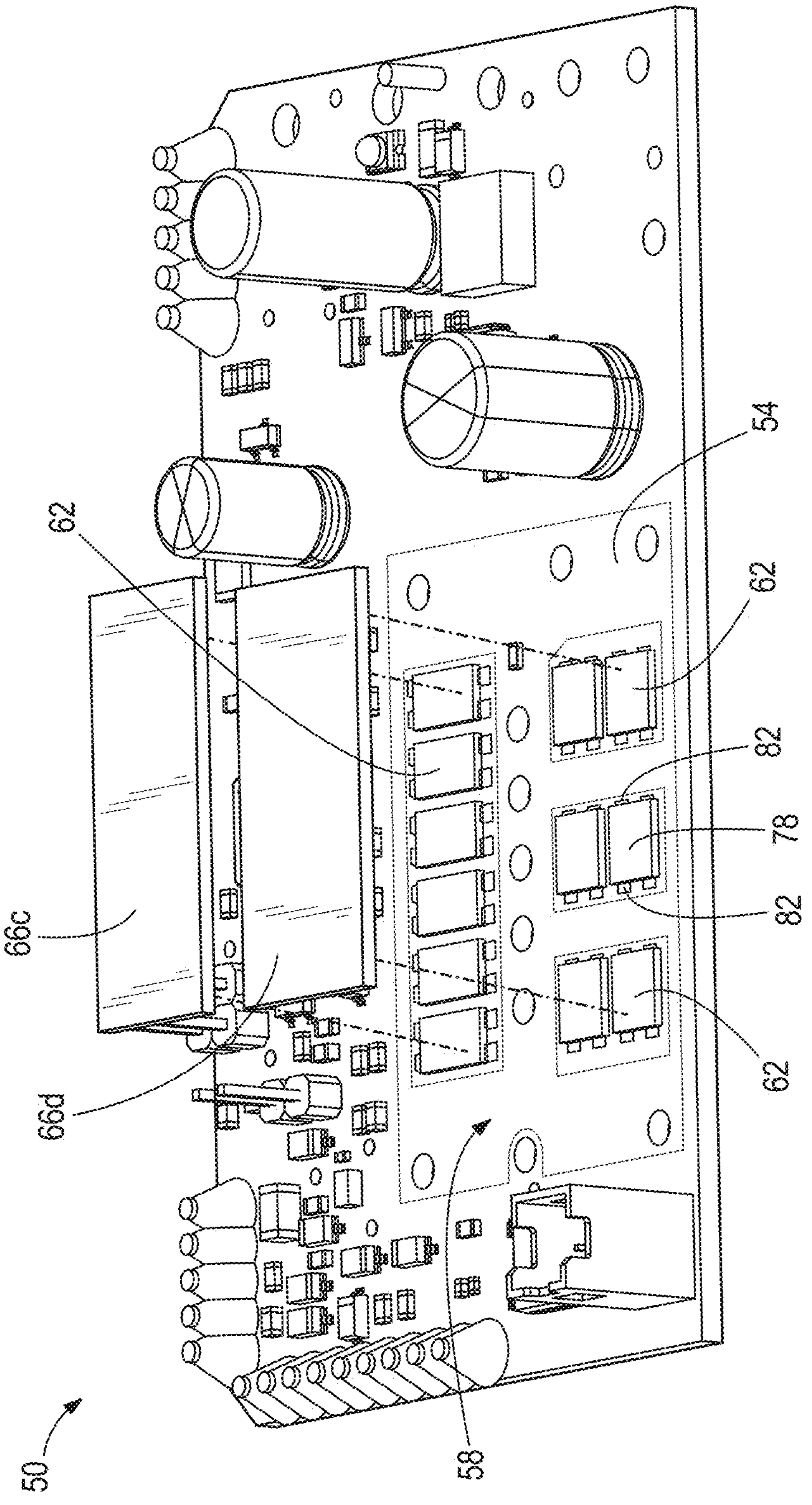
FIG. 6 is a perspective view of an electronics assembly of a power tool in accordance with some embodiments.

In the example illustrated in FIG. 6, the FETs 62 are surface mount FETs are mounted directed to the connection surface of the PCB 54. Each FET 62 includes a body portion 78, connection terminals 82 extending from a first side and a second side of the body portion 78. In the examples illustrated, the connection terminals 82 are provided on opposite sides of the FET 62. The plurality of FETs 62 are surface-mounted on the PCB 54 by, for example, soldering the connection terminals 82 to corresponding wire traces on the PCB 54. The body portion 78 includes, for example, a cuboid shape with two surfaces having a larger surface area compared to the other four surfaces. The body portion 78 extends horizontally along the PCB 54 such that the larger surfaces of the body portion 78 are parallel to the PCB 54. The FETs 62 are, for example, SO-8, Copperstrap SO-8, PowerPak, or DirectFET™ marketed and sold by Infineon Technologies. In the example illustrated, a total of twelve FETs 62, six high-side and six low-side, are mounted to the PCB 54.

In the example illustrated in FIG. 6, a first heat sink 66*c* and a second heat sink 66*d* are provided over the FETs 62 (FIG. 6 illustrates the heat sinks 66*c*, 66*d* exploded away from the PCB 54). As described above, "heat sink 66" is used to generically refer to both heat sinks 66*c* and 66*d*. The first heat sink 66*c* and the second heat sink 66*d* may be mounted to the PCB 54 such that a surface of the first heat sink 66*c* is in thermal communication or a facing relationship (heat-transfer relationship) with the body portion 78 of the high-side FETs 62 and the second heat sink 66*d* is in a facing relationship (heat-transfer relationship) with the body portion 78 of the low-side FETs 62. The configuration between the PCB 54, the heat sinks 66*c*, 66*d* and the plurality of FETs 62 is such that a first larger surface of the body portion 78 of the FETs 62 is in a facing relationship with the PCB 54 and a second larger surface of the body portion 78 of the FETs 62 is in a facing relationship (heat-transfer relationship) with one of the heat sinks 66*c*, 66*d*. In other embodiments, a single heat sink 66 may be provided in a facing relationship (heat-transfer relationship) with the body portion 78 of all twelve FETs 62. In some embodiments, the inverter bridge may include six FETs 62 as described above with respect to FIGS. 4 and 5 above.

As described above, the motor 46 may be intermittently actuated for short durations, which results in short durations of air flow generated by the motor-driven fan to cool the plurality of FETs 62. To increase the heat absorption and dissipation capability of the heat sink 66, the heat sink 66 may be coated with a material having high emissivity. As used herein, emissivity refers to an emissivity coefficient that indicates the radiation of heat from a material compared with the radiation of heat from an ideal 'black body' radiator. For reference, the emissivity of an ideal black body radiator is 1, while the emissivity of polished aluminum is about 0.05.

In some embodiments, a material with high emissivity may have an emissivity greater than or equal to 0.1. In some embodiments, a material with high emissivity may have an emissivity greater than or equal to 0.3. In some embodiments, a material with high emissivity may have an emissivity greater than or equal to 0.4. In some embodiments, a material with high emissivity may have an emissivity greater than or equal to 0.5. In some embodiments, a material with high emissivity may have an emissivity over greater than or equal to. In other embodiments, a material with high emissivity may have an emissivity greater than or equal to 0.7.

In some embodiments, high emissivity materials, for example, carbon (emissivity=0.81), gold (emissivity=0.47), and the like may be used to coat the heat sink 66. In one example, the heat sink 66 is coated with an anodized aluminum coating (emissivity=0.85) compared to bare aluminum (emissivity=0.05). In some embodiments, the emissivity of the heat sink 66, or a material coating the heat sink 66, is in a range of at least one selected from the group including: between 0.1 and 0.85, between 0.2 and 0.85, between 0.3 and 0.85, between 0.4 and 0.85, between 0.5 and 0.85, between 0.6 and 0.85, and between 0.7 and 0.85.

In other embodiments, in addition to or instead of the high emissivity coating, the finish of a heat sink 66 may be varied to increase the emissivity of the heat sink 66. For example, the heat sink 66 may be finished to have a matte surface, a textured surface, a rough surface or the like may be used in place of heat sinks 66 having polished, shiny, or reflective surface finishes. In some embodiments, a rough surface in combination with a high emissivity coating may be used to further improve the heat absorbing properties of the heat sink 66.

Providing additional heat dissipation as described above provides the advantage of avoiding tool shutdown due to overheating or at least increasing the number of power tool actuations before tool shutdown due to overheating. For example, the number of actuations of the fastener driver 10 may be significantly increased before the fastener driver 10 shuts down due to over-heating compared to a nailer having a similar construction but a lower emissivity heat sink.

Thus, various embodiments described herein provide for power tools including heat sinks having high emissivity. Various features and advantages are set forth in the following claims.

I claim:

1. A power tool comprising:
a power source;
a motor;
a power switching network coupled between the power source and the motor including a plurality of switches; and
a heat sink in a heat-transfer relationship with the plurality of switches, wherein the heat sink includes a high emissivity material having an emissivity of greater than or equal to 0.4; and
a printed circuit board, wherein the plurality of switches are connected to the printed circuit board,
the heat sink is mounted to the printed circuit board and extends in a direction perpendicular to the printed circuit board such that a length dimension of the heat sink in the direction perpendicular to the printed circuit board is larger than a length dimension of the heat sink in a direction parallel to the printed circuit board, and
the plurality of switches are mounted to the heat sink such that a larger surface area of a body portion of each of the plurality of switches is in the heat-transfer relationship with the heat sink.

2. The power tool of claim 1, wherein the emissivity of the high emissivity material is between 0.4 and 0.85.

3. The power tool of claim 1, wherein the heat sink is coated with the high emissivity material.

4. The power tool of claim 1, wherein the heat sink includes a high emissivity finish.

5. The power tool of claim 4, wherein the high emissivity finish includes a textured surface.

6. The power tool of claim 4, wherein the high emissivity finish includes a matte surface.

7. The power tool of claim 1, wherein the motor is configured to be driven intermittently for periods of time such that an air circulation generated by a fan coupled to the motor is not sufficient to dissipate excess heat generated by the plurality of switches.

8. A power tool comprising:
a power source;
a motor;

a power switching network coupled between the power source and the motor including a plurality of switches; and a heat sink in a heat-transfer relationship with the plurality of switches, wherein the heat sink includes a high emissivity material having an emissivity of greater than or equal to 0.4; and a printed circuit board, wherein the plurality of switches are connected to the printed circuit board, the plurality of switches are surface mounted to the printed circuit board; and wherein the heat sink is provided above the plurality of switches such that a first larger surface area of a body portion of the plurality of switches is in a facing relationship with the printed circuit board and a second larger surface area of the body portion of the plurality of switches is in the heat-transfer relationship with the heat sink.

9. The power tool of claim 8, wherein the heat sink includes a high emissivity finish.

10. The power tool of claim 9, wherein the high emissivity finish includes a textured surface.

11. The power tool of claim 9, wherein the high emissivity finish includes a matte surface.

12. The power tool of claim 9, wherein the material emissivity of the high emissivity material is between 0.4 and 0.85.

13. The power tool of claim 8, wherein the motor is configured to be driven intermittently for periods of time such that an air circulation generated by a fan coupled to the motor is not sufficient to dissipate excess heat generated by the plurality of switches.

14. A power tool comprising:

a power source;

a motor;

a power switching network coupled between the power source and the motor including a plurality of switches, wherein each of the plurality of switches includes a body portion, connection terminals extending from a first side of the body portion, and a mounting portion extending from a second side of the body portion opposite the first side;

a heat sink in a heat-transfer relationship with the plurality of switches, wherein the heat sink includes a high emissivity material having an emissivity of greater than or equal to 0.4; and a printed circuit board, wherein the plurality of switches are connected to the printed circuit board, the heat sink has a T-shaped structure such that a bottom of the heat sink forming the bottom of the T-shaped structure is in contact with the printed circuit board a top of the T-shaped structure includes a horizontal portion having a substantially similar thickness as a vertical portion of the T-shaped structure, and the plurality of switches are mounted to the heat sink using a fastener inserted through the mounting portion of each of the plurality of switches such that a larger surface area of the body portion of each of the plurality of switches is in the heat-transfer relationship with the heat sink.

15. The power tool of claim 14, wherein the heat sink is coated with the high emissivity material.

16. The power tool of claim 14, wherein the heat sink includes a high emissivity finish.

17. The power tool of claim 16, wherein the high emissivity finish includes a textured surface.

18. The power tool of claim 14, wherein the material emissivity of the high emissivity material is between 0.4 and 0.85.

19. The power tool of claim 14, wherein the motor is configured to be driven intermittently for periods of time such that an air circulation generated by a fan coupled to the motor is not sufficient to dissipate excess heat generated by the plurality of switches.

20. The power tool of claim 14, wherein the heat sink is coated with the high emissivity material.

* * * * *